(12) United States Patent
Lin

(10) Patent No.: US 9,252,105 B2
(45) Date of Patent: Feb. 2, 2016

(54) CHIP PACKAGE

(71) Applicant: NANYA TECHNOLOGY CORPORATION, Tao-Yuan Hsien (TW)

(72) Inventor: Po Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 262 days.

(21) Appl. No.: 14/155,590

(22) Filed: Jan. 15, 2014

(65) Prior Publication Data

US 2015/0200163 A1    Jul. 16, 2015

(51) Int. Cl.
*H01L 29/40*    (2006.01)
*H01L 23/538*    (2006.01)
*H01L 25/07*    (2006.01)
*H01L 23/522*    (2006.01)

(52) U.S. Cl.
CPC ........ *H01L 23/5384* (2013.01); *H01L 23/5386* (2013.01); *H01L 25/074* (2013.01); *H01L 23/5226* (2013.01); *H01L 2224/16145* (2013.01)

(58) Field of Classification Search
CPC ....................................................... H01L 29/40
See application file for complete search history.

(56) References Cited

U.S. PATENT DOCUMENTS 6,448,661 B1    9/2002    Kim et al.

*Primary Examiner* — Marvin Payen
(74) *Attorney, Agent, or Firm* — WPAT, P.C.; Anothony King

(57) ABSTRACT

A chip of a chip package comprises a substrate having a chip circuit, a chip selection terminal connecting to the chip circuit, multiple first conductors separated at different levels by multiple insulation layers, multiple first vertical connections respectively connecting to the first conductors and extending to a substrate surface, multiple second vertical connections respectively connecting to the first conductors and extending to a surface of the insulation layers, a third vertical connection electrically connecting to the chip selection terminal and extending to the substrate surface, a fourth vertical connection formed through the insulation layers and the substrate, a second conductor formed on the surface of the insulation layers and connecting to the fourth vertical connection, multiple first pads respectively connecting to the first vertical connections and the third vertical connection, and multiple second pads respectively connecting to the second vertical connections.

20 Claims, 6 Drawing Sheets

CHIP PACKAGE

BACKGROUND OF THE INVENTION

1. Technical Field

The present invention relates to a chip package including at least one stackable chip.

2. Background

Chip stacking technology can bring two chips close together, thereby enabling faster data transmission between the two chips and consuming less power. Memory chips can be stacked together to obtain a memory module with a large storage capacity. In addition to stacking two of the same chip, two chips with different functions may also be stacked together to combine different functions.

In a memory chip stack, each memory chip has a chip select (CS) terminal, which is used to enable the memory chip. For example, a DRAM chip can have a row address strobe (RAS), column address strobe, or chip select pin as a chip select terminal. When a signal is applied to the chip select terminal of a chip in a memory chip stack, the chip can be accessed, while other chips cannot.

Conventionally, signals applied to the chip select terminals of the memory chip stack flow through wires. Such wires need additional processes to form, which increases the manufacturing cost. Moreover, long wires cause signal delays by occupying more space, and results in a large chip package.

SUMMARY

One embodiment of the present invention discloses a chip package. The chip package comprises at least one chip. The at least one chip comprises a substrate, a chip circuit formed on the substrate, a plurality of insulation layers formed on the substrate or within the insulation layers, a chip selection terminal formed on the substrate and connecting to the chip circuit for enabling the chip circuit, a plurality of first conductors separated at different levels by the plurality of insulation layers, a plurality of first vertical connections respectively connecting to the plurality of first conductors and extending to a surface of the substrate opposite to the plurality of insulation layers, a plurality of second vertical connections respectively connecting to the plurality of first conductors and extending to a surface of the plurality of insulation layers opposite to the substrate, a third vertical connection electrically connecting to the chip selection terminal and extending to the surface of the substrate, a fourth vertical connection formed through the plurality of insulation layers and the substrate, a second conductor formed on the surface of the plurality of insulation layers and connecting to the fourth vertical connection, a plurality of first pads formed on the surface of the substrate and respectively connecting to the plurality of first vertical connections and the third vertical connection, and a plurality of second pads formed on the surface of the plurality of insulation layers and respectively connecting to the plurality of second vertical connections.

One embodiment of the present invention discloses another chip package. The chip package comprises at least one chip. The at least one chip comprises a substrate, a chip circuit formed on the substrate, a plurality of insulation layers formed on the substrate, a chip selection terminal formed on or in the plurality of insulation layers covering a circuit form on the substrate and connecting to the chip circuit for enabling the chip circuit, a plurality of first conductors separated at different levels by the plurality of insulation layers, a plurality of first vertical connections respectively connecting to the plurality of first conductors and extending to a surface of the substrate opposite to the plurality of insulation layers, a plurality of second vertical connections respectively connecting to the plurality of first conductors and extending to a surface of the plurality of insulation layers opposite to the substrate, a third vertical connection connecting to the chip selection terminal and extending to the surface of the plurality of insulation layers, and a second conductor formed on the surface of the plurality of insulation layers covering the circuit and connecting to the third vertical connection.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1A:
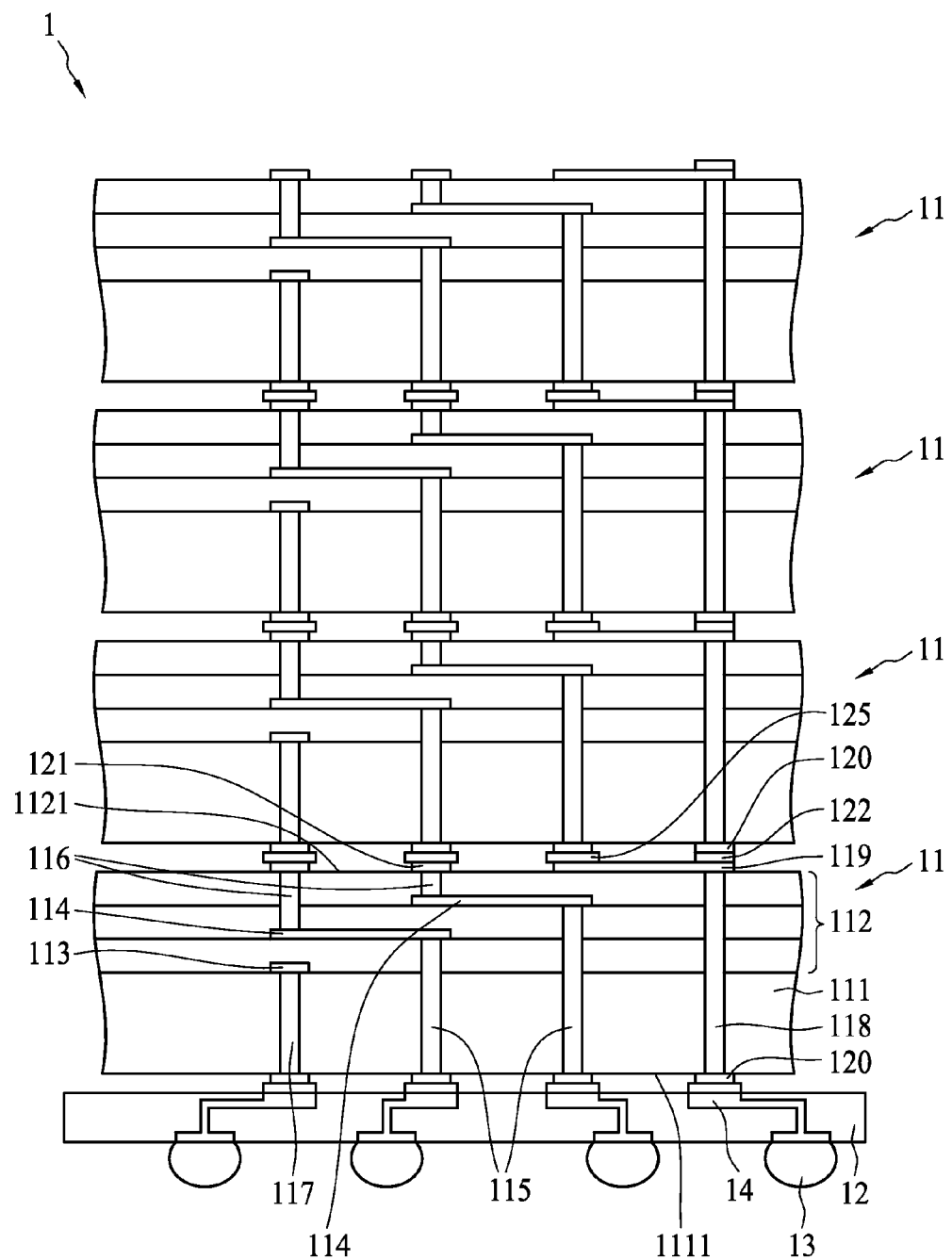
FIG. 1A schematically shows a chip package according to one embodiment of the present invention.

FIG. 1A schematically shows a chip package 1 according to one embodiment of the present invention. As shown in FIG. 1A, the chip package 1 comprises at least one chip 11. In the present embodiment, the chip package 1 comprises a plurality of chips 11. The plurality of chips 11 are stacked on a circuit board 12, wherein the bottom surface of the circuit board 12 is attached to a plurality of solder bumps 13. The solder bumps 13 correspond to the chips 11 of the chip package 1. The chip package 1 electrically connects to pads 14 formed on the upper surface of the circuit board 12 and connected to corresponding solder bumps 13. When a signal is applied on a solder bump 13, a corresponding chip 11 can be enabled.

The chip 11 can be a memory chip such as a DRAM chip or flash memory chip. Essentially, a memory chip may comprise address input terminals for addressing memory cells, data input/output terminals for transmitting data to/from memory cells, and power supply terminals. The terminals of the chips 11 of the chip package 1 may be connected.

Referring to FIG. 1A, each chip 11 comprises a substrate 111, a chip circuit, a plurality of insulation layers 112, and a chip selection terminal 113. The substrate 111 may be used as a base for manufacturing the chip 11. The chip circuit is formed on the substrate 111. The chip selection terminal 113 may be formed on the substrate 111 and connected to the chip circuit. The chip selection terminal 113 is used to enable the chip circuit. The plurality of insulation layers 112 are separately formed and vertically stacked on the substrate 111. The substrate 111 may comprise silicon or other suitable materials. The substrate 111 can be a part of a wafer. The plurality of insulation layers 112 can have the same thickness or different thicknesses. The plurality of insulation layers 112 can be made of an inorganic material such as nitride or organic material such as polyimide, oxide and epoxy. The insulation layers 112 can be formed using other suitable materials. In one embodiment, the chip selection terminal 113 is formed between the substrate 111 and the plurality of insulation layers 112.

Referring to FIG. 1A, the chip 11 may comprise a plurality of first conductors 114, which are formed within the chip 11. The first conductor 114 can be a pad. The first conductor 114 can be a trace or a wire. The plurality of first conductors 114 are separated at different levels by the plurality of insulation layers 112. In one embodiment, each conductor 114 is formed on a corresponding one of the substrate 111 and the insulation layers 112 or on a corresponding one of the insulation layers 112 so that the plurality of first conductors 114 are formed at different levels.

In one embodiment, the plurality of first conductors 114 can have the same length. In an alternate embodiment, at least a portion of the plurality of first conductors 114 can have different lengths.

Referring to FIG. 1A, the chip 11 can further comprise a plurality of first vertical connections 115. The plurality of first vertical connections 115 respectively connect to the plurality of first conductors 114 and extend to a surface 1111 of the substrate 111 opposite to the plurality of insulation layers 112. In one embodiment, each first vertical connection connects to a first end of a corresponding first conductor 114.

Referring to FIG. 1A, the chip 11 may further comprise a plurality of second vertical connections 116. The plurality of second vertical connections 116 respectively connect to the plurality of first conductors 114 and extend to a surface 1121 of the plurality of insulation layers 112. In one embodiment, each second vertical connection 116 respectively connects to a second end of a corresponding first conductor 114 opposite to the first end of the corresponding first conductor 114.

Referring to FIG. 1A, each chip 11 comprises a third vertical connection 117. The third vertical connection 117 electrically connects to the chip selection terminal 113 and extends to the surface 1111 of the substrate 111. In one embodiment, the third vertical connection 117 directly connects to the chip selection terminal 113. In one embodiment, the third vertical connection 117 and a portion of the plurality of the first vertical connections 115 are aligned vertically with the plurality of second vertical connections 116. In one embodiment, one second vertical connection 116 is formed above the chip selection terminal 113.

Referring to FIG. 1A, each chip 11 comprises a fourth vertical connection 118. The fourth vertical connection 118 is formed through the plurality of insulation layers 112 and the substrate 111.

Referring to FIG. 1A, each chip 11 comprises a second conductor 119. The second conductor 119 is formed on the surface 1121 of the plurality of insulation layers 112 and connects to the fourth vertical connection 118. In one embodiment, the second conductor 119 extends above an adjacent first vertical connection 115.

Referring to FIG. 1A, each chip 11 comprises a plurality of first pads 120. The plurality of first pads 120 are formed on the surface 1111 of the substrate 111 and respectively connect to the plurality of first vertical connections 115, the third vertical connection 117 and the fourth vertical connection 118. The first pads 120 of a chip 11 are used to connect to a lower chip 11 or the circuit board 12 in the chip package 1.

Referring to FIG. 1A, each chip 11 comprises a plurality of second pads 121. The plurality of second pads 121 are formed on the surface 1121 of the plurality of insulation layers 112 and respectively connect to the plurality of second vertical connections 116. The plurality of second pads 121 of a chip 11 are used to connect an upper chip 11.

Referring to FIG. 1A, a plurality of chips 11 are stacked on the circuit board 12. Each first pad 120 of the lowest chip 11 is attached to a corresponding pad 14 of the circuit board 12 by a conductive material or solder material 125. Between two adjacent chips 11, each of the first pads 120 of the upper chip 11 connects to one second pad 121 or the second conductor 119 of the lower chip 11 with a conductive material or solder material 125. When a signal is applied to, for example, the second solder bump 13 from the left, the signal will transmit to the leftmost first pad 120 of the second lower chip 11, which connects to the chip select terminal 113 such that the second lower chip 11 can be enabled for being accessed.

Referring to FIG. 1A, in one embodiment, each chip 11 may comprise an insulation pad 122 formed on the second conductor 119. The insulation pad 122 is used to electrically insulate two adjacent chips 11. In one embodiment, the insulation pad 122 partially covers the second conductor 119. In one embodiment, the second conductor 119 comprises copper.

In one embodiment, each first vertical connection 115, each second vertical connection 116, the third vertical connection 117, or the fourth vertical connection 118 comprises tungsten, copper or the like.

In one embodiment, the first conductor 114 or the second conductor 119 comprises copper, tungsten, or other suitable materials.

Figure 1B:
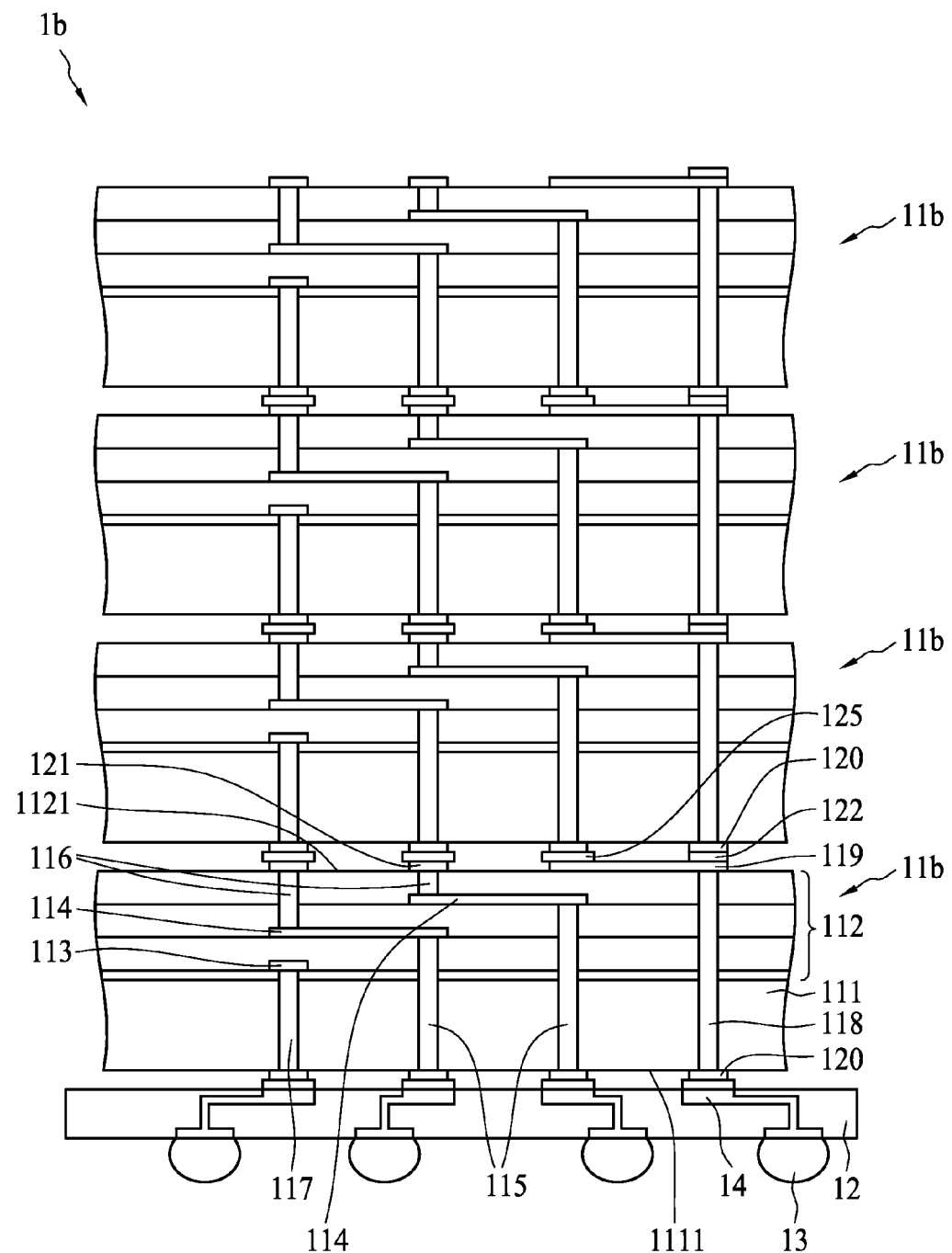
FIG. 1B schematically shows a chip package according to another embodiment of the present invention.

FIG. 1B schematically shows a chip package 1b according to one embodiment of the present invention. Referring to FIGS. 1A and 1B, the chip package 1b of FIG. 1B is similar to that of FIG. 1A. One major difference is that the chip selection terminal 113 of each chip 11b of FIG. 1B is formed within the plurality of insulation layers 112.

Figure 2A:
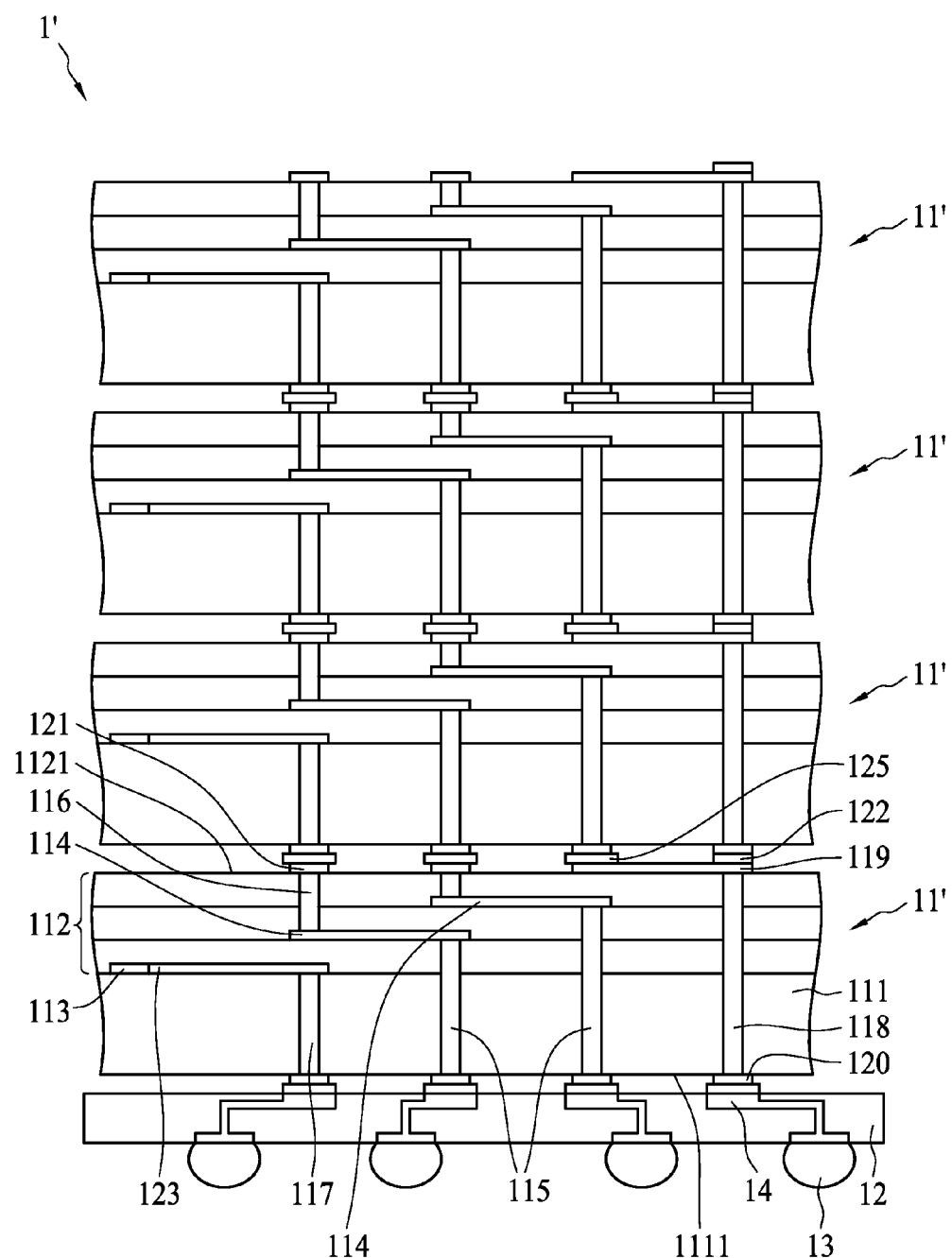
FIG. 2A schematically shows another chip package according to one embodiment of the present invention.

FIG. 2A schematically shows another chip package 1' according to one embodiment of the present invention. Referring to FIGS. 1A and 2A, the chip package 1' of FIG. 2A is similar to the chip package 1, and one of the major differences between the two chip packages 1 and 1' is that each chip 11' of the chip package 1' further comprises a third conductor 123 and the chip selection terminal 113 is not below any second vertical connection 116 or a conductor. The third conductor 123 is formed at the same level as the chip selection terminal 113 and connects the chip selection terminal 113 and the third vertical connection 117.

Figure 2B:
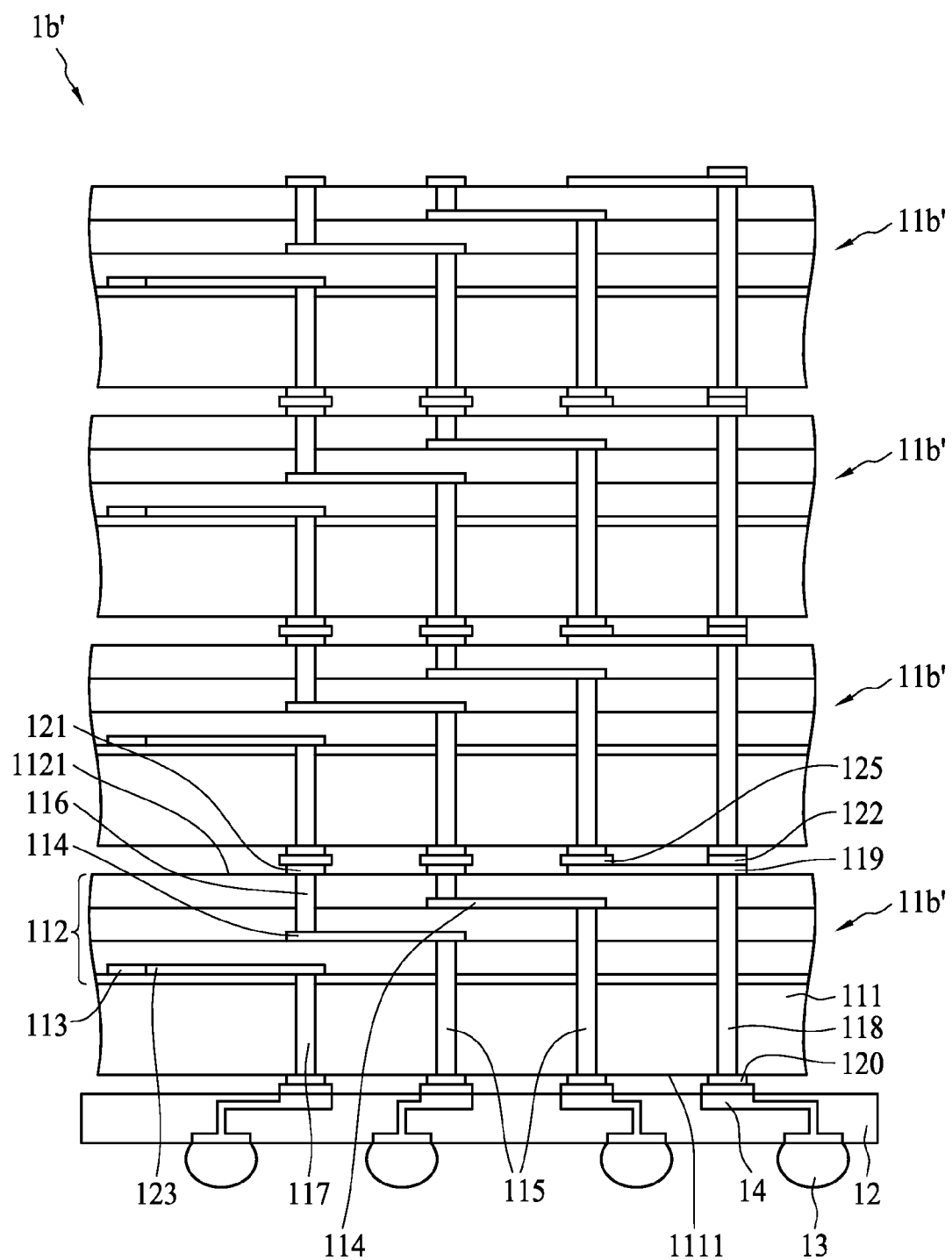
FIG. 2B schematically shows another chip package according to another embodiment of the present invention.

FIG. 2B schematically shows another chip package 1b' according to one embodiment of the present invention. Referring to FIGS. 2A and 2B, the chip package 1b' of FIG. 2B is similar to that of FIG. 2A. One major difference is that the chip selection terminal 113 of each chip 11b' of FIG. 2B is formed within the plurality of insulation layers 112.

Figure 3:
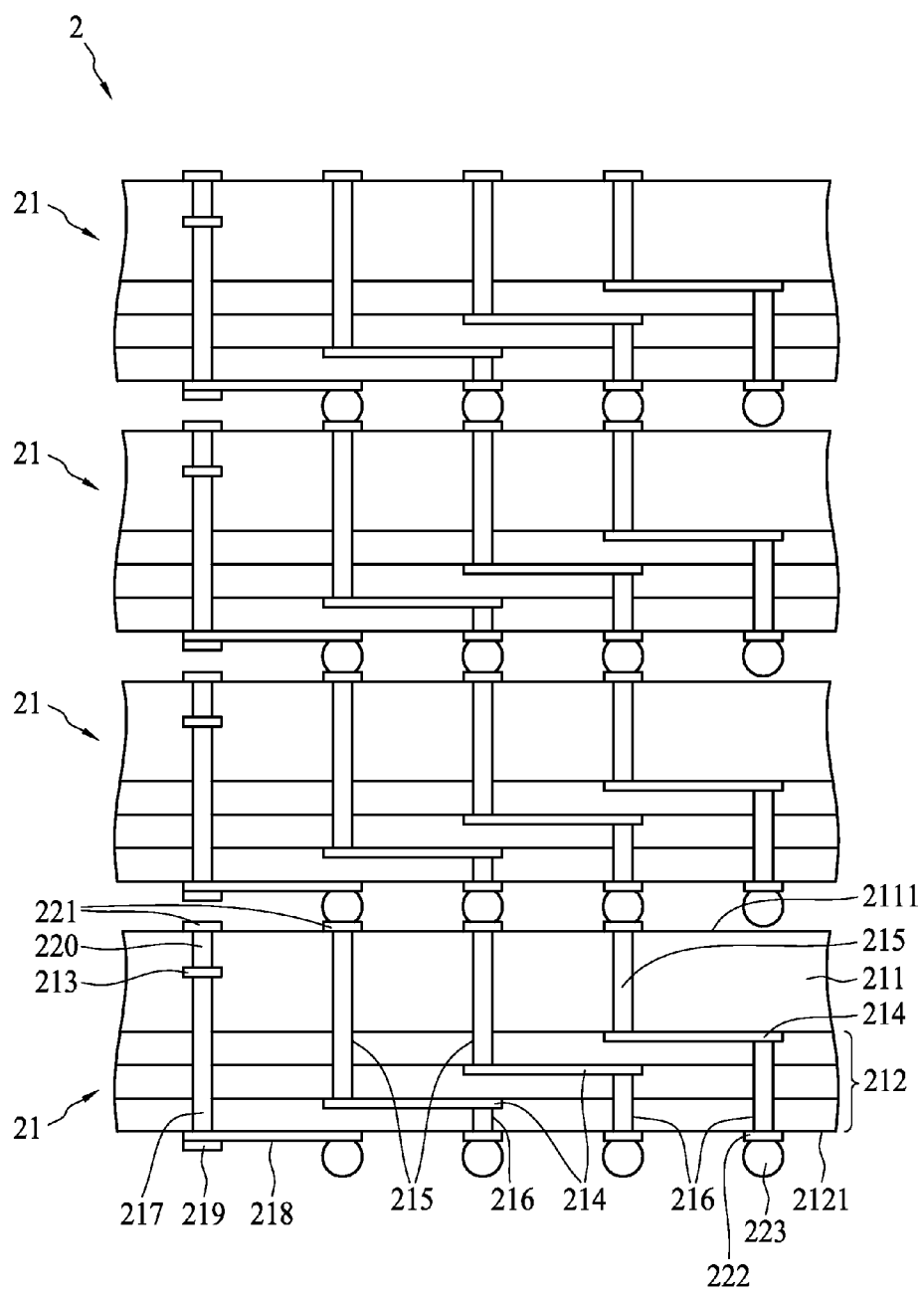
FIG. 3 schematically shows a chip package according to another embodiment of the present invention.

FIG. 3 schematically shows a chip package 2 according to another embodiment of the present invention. Referring to FIG. 3, the chip package 2 comprises at least one chip 21. In one embodiment, the chip package 2 comprises a plurality of chips 21 stacked on each other.

Referring to FIG. 3, each chip 21 comprises a substrate 211, a chip circuit, a plurality of insulation layers 212, and a chip selection terminal 213. The substrate 211 may be used as a base for manufacturing the chip 21. The chip circuit is formed on the substrate 211. The chip selection terminal 213 is used to enable the chip circuit. The plurality of insulation layers 212 are separately formed and vertically stacked on the substrate 211. The substrate 211 may comprise silicon or other suitable materials. The substrate 211 can be a part of a wafer. The plurality of insulation layers 212 can have the same thickness or different thicknesses. The plurality of insulation layers 212 can be made of an inorganic material such as nitride or organic material such as polyimide, oxide and epoxy. The insulation layers 212 can be formed using other suitable materials.

In one embodiment, the chip selection terminal 213 is formed on the substrate 211.

Referring to FIG. 3, each chip 21 comprises a plurality of first conductors 214 formed within the chip 21. The first conductor 214 can be a pad. The first conductor 214 can be a trace or a wire. The plurality of first conductors 214 are separated at different levels by the plurality of insulation layers 212. In one embodiment, each first conductor 214 is formed on the substrate 211 or a corresponding insulation layer 212.

In one embodiment, the plurality of first conductors 214 can have the same length. In one embodiment, at least a portion of the plurality of first conductors 214 can have different lengths.

Referring to FIG. 3, each chip 21 comprises a plurality of first vertical connections 215. The plurality of first vertical connections 215 respectively connect to the plurality of first conductors 214 and extend to a surface 2111 of the substrate 211 opposite to the plurality of insulation layers 212. In one embodiment, each first vertical connection 215 connects to a first end of a corresponding first conductor 214.

In one embodiment, the plurality of insulation layers 212 are formed on a back surface of the substrate 211. Each chip 21 includes a front side circuit that is formed on the surface 2111, and an additional plurality of insulation layers can be formed on the front side of the substrate 211 and covers the front side circuit, wherein the chip selection terminal 213 is formed between the substrate 211 and the plurality of insulation layers formed on the front side circuit, or within the plurality of insulation layers formed on the front side circuit.

Referring to FIG. 3, each chip 21 comprises a plurality of second vertical connections 216. The plurality of second vertical connections 216 respectively connect to the plurality of first conductors 214 and extend to a surface 2121 of the plurality of insulation layers 212 opposite to the substrate 211. In one embodiment, each second vertical connection 216 respectively connects to a second end of a corresponding first conductor 214 opposite to the first end of the corresponding first conductor 214.

In one embodiment, a portion of the plurality of first vertical connections 215 are aligned vertically with a portion of the plurality of second vertical connections 216.

Referring to FIG. 3, each chip 21 comprises a third vertical connection 217. The third vertical connection 217 connects to the chip selection terminal 213 and extends to the surface 2121 of the plurality of insulation layers 212. In one embodiment, the third vertical connection 217 directly connects to the chip selection terminal 213.

Referring to FIG. 3, each chip 21 comprises a second conductor 218. The second conductor 218 is formed on the surface 2111 of the substrate 211 and connects to the third vertical connection 217. In one embodiment, the second conductor 218 extends to a location above or below the first vertical connection 215 that is not aligned vertically with any second vertical connection 216.

Referring to FIG. 3, in one embodiment, each chip 21 comprises an insulation pad 219. The insulation pad 219 is formed on the second conductor 218. The insulation pad 219 is used to electrically insulate two adjacent chips 21 in the chip package 2. In one embodiment, the insulation pad 219 partially covers the second conductor 218.

Referring to FIG. 3, each chip 21 comprises a fourth vertical connection 220. The fourth vertical connection 220 connects to the chip selection terminal 213 and extends to the surface 2111 of the substrate 211. In one embodiment, the third and fourth vertical connections 217 and 220 are aligned vertically.

Referring to FIG. 3, each chip 21 comprises a plurality of first pads 221. The plurality of first pads 221 are formed on the surface 2111 of the substrate 211 and respectively connect to the fourth vertical connection 220 and the plurality of first vertical connections 215. In one embodiment, the plurality of first pads 221 are used to connect to an upper chip 21 in the chip package 2.

Referring to FIG. 3, each chip 21 comprises a plurality of second pads 222. The plurality of second pads 222 are formed on the surface 2121 of the plurality of insulation layers 212 and respectively connect to the plurality of second vertical connections 216. The plurality of second pads 222 are used to connect to a lower chip 21 or a circuit board. In one embodiment, a solder or copper pillar bump 223 is formed on a corresponding second pad 222. In another embodiment, a solder or copper pillar bump 223 is formed on a corresponding first pad 221.

Figure 4:
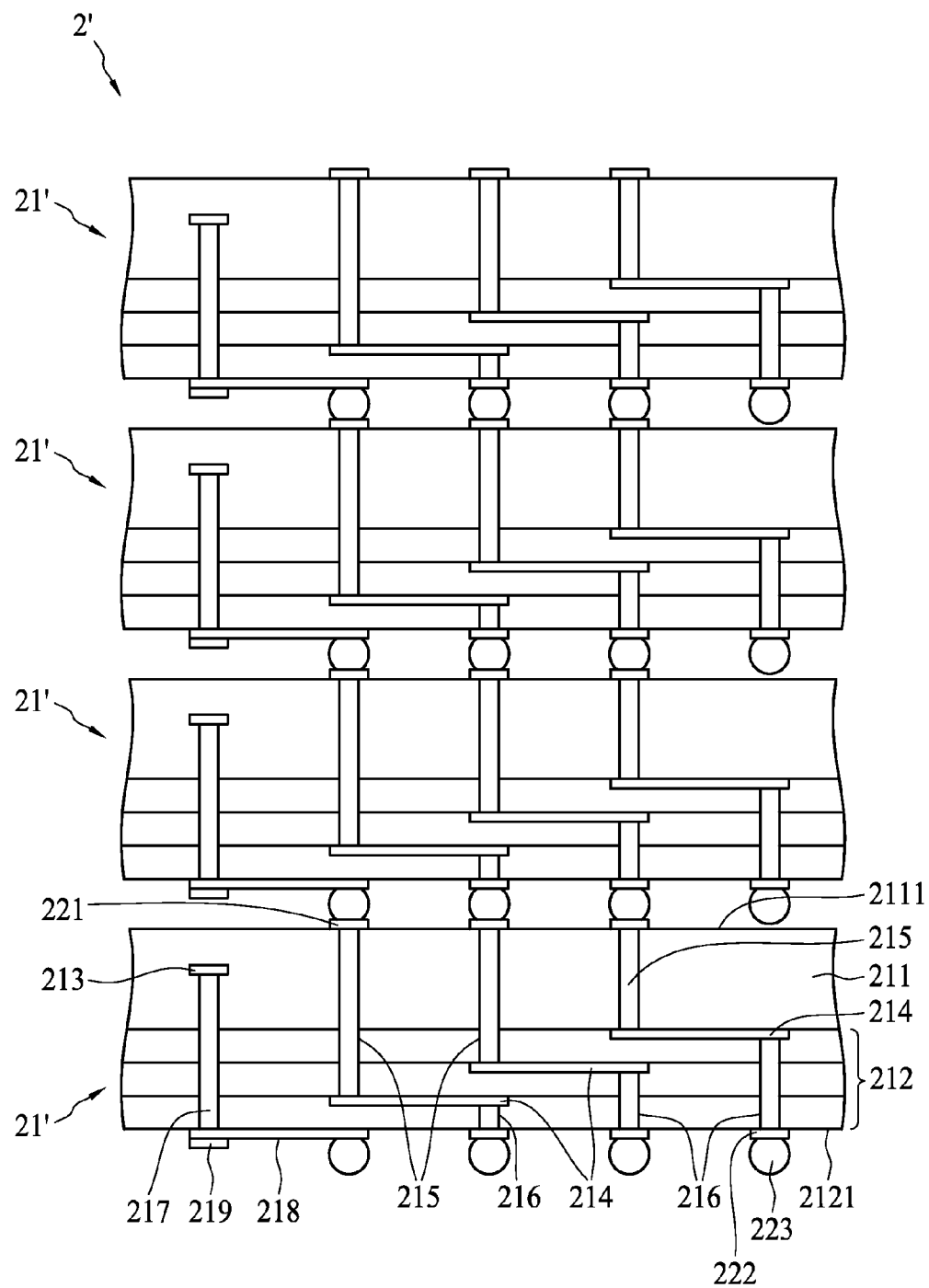
FIG. 4 schematically shows a chip package according to another embodiment of the present invention.

FIG. 4 schematically shows a chip package 2' according to another embodiment of the present invention. Referring to FIGS. 3 and 4, the chip package 2' of FIG. 4 is similar to the chip package 2 of FIG. 3, and one of the major differences is that each chip 21' of the chip package 2' does not include the fourth vertical connection 220. Thus, there is not a vertical connection through the substrate 211 and the plurality of insulation layers 212. Similarly, the chip selection terminal 213 of the chip 21' of FIG. 4 is similar to the chip selection terminal 213 of the chip 21; the chip selection terminal 213 of the chip 21' is between the substrate 211 and the insulation layers formed on the front side of the substrate 211 or within the insulation layers formed on the front side of the substrate 211.

A chip package of at least some embodiments of the present invention uses vertical connections formed within chips of the chip package to enable the chips. The vertical connections are respectively connected by conductors formed at different levels. Therefore, signal transmission paths are short and the manufacturing cost is low.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chip package comprising at least one chip, the at least one chip comprising:
   a substrate;
   a chip circuit formed on the substrate;
   a plurality of insulation layers formed on the substrate;
   a chip selection terminal formed on the substrate or within the insulation layers and connecting to the chip circuit for enabling the chip circuit;
   a plurality of first conductors separated at different levels by the plurality of insulation layers;
   a plurality of first vertical connections respectively connecting to the plurality of first conductors and extending to a surface of the substrate opposite to the plurality of insulation layers;
   a plurality of second vertical connections respectively connecting to the plurality of first conductors and extending to a surface of the plurality of insulation layers opposite to the substrate;
   a third vertical connection electrically connecting to the chip selection terminal and extending to the surface of the substrate;
   a fourth vertical connection formed through the plurality of insulation layers and the substrate;
   a second conductor formed on the surface of the plurality of insulation layers and connecting to the fourth vertical connection;
   a plurality of first pads formed on the surface of the substrate and respectively connecting to the plurality of first vertical connections, the third vertical connection and the fourth vertical connection; and
   a plurality of second pads formed on the surface of the plurality of insulation layers and respectively connecting to the plurality of second vertical connections.

2. The chip package of claim 1, further comprising a third conductor connecting the third vertical connection and the chip selection terminal.

3. The chip package of claim 1, wherein the chip selection terminal is formed between the substrate and the plurality of insulation layers, or within the insulation layers.

4. The chip package of claim 1, further comprising an insulation pad formed on the second conductor.

5. The chip package of claim 4, wherein the insulation pad partially covers the second conductor.

6. The chip package of claim 1, wherein each first conductor uses different ends to connect to a corresponding one of the plurality of first vertical connections and a corresponding one of the plurality of second vertical connections.

7. The chip package of claim 1, wherein the third vertical connection and a portion of the plurality of the first vertical connections are aligned vertically with the plurality of second vertical connections.

8. The chip package of claim 1, wherein the plurality of first pads or the plurality of second pads comprise copper, aluminum, a solder, or tungsten.

9. The chip package of claim 1, wherein each first vertical connection, each second vertical connection, the third vertical connection, or the fourth vertical connection comprises copper or tungsten.

10. The chip package of claim 1, further comprising a plurality of solder or copper pillar bumps respectively formed on the plurality of first or second pads.

11. A chip package comprising at least one chip, the at least one chip comprising:
    a substrate;
    a chip circuit formed on the substrate;
    a plurality of insulation layers formed on the substrate;
    a chip selection terminal formed on the substrate or in additional insulation layers covering a circuit formed on the substrate and connecting to the chip circuit for enabling the chip circuit;
    a plurality of first conductors separated at different levels by the plurality of insulation layers;
    a plurality of first vertical connections respectively connecting to the plurality of first conductors and extending to a surface of the substrate opposite to the plurality of insulation layers;
    a plurality of second vertical connections respectively connecting to the plurality of first conductors and extending to a surface of the plurality of insulation layers opposite to the substrate;
    a third vertical connection connecting to the chip selection terminal and extending to the surface of the plurality of insulation layers; and
    a second conductor formed on the surface of the additional plurality of insulation layers and connecting to the third vertical connection.

12. The chip package of claim 11, wherein each first conductor uses different ends to respectively connect to a corresponding one of the first vertical connections and a corresponding one of the second vertical connections.

13. The chip package of claim 11, further comprising an insulation pad formed on the second conductor.

14. The chip package of claim 13, wherein the insulation pad partially covers the second conductor.

15. The chip package of claim 11, further comprising a fourth vertical connection connecting to the chip selection terminal and extending to the surface of the substrate.

16. The chip package of claim 15, wherein the third and fourth vertical connections are aligned vertically.

17. The chip package of claim 11, wherein a portion of the plurality of first vertical connections are respectively aligned with a portion of the plurality of second vertical connections in a vertical direction.

18. The chip package of claim 11, further comprising a plurality of first pads respectively connecting to the plurality of first vertical connections.

19. The chip package of claim 11, further comprising a plurality of second pads respectively connecting to the plurality of second vertical connections.

20. The chip package of claim 19, further comprising a plurality of solder or copper pillar bumps respectively formed on the plurality of first or second pads.

* * * * *